United States Patent

[11] 3,597,665

[72] Inventors John G. Quetsch, Jr.
Anaheim;
Frank J. Saia, Costa Mesa, both, Calif.

[21] Appl. No. 670,487
[22] Filed Aug. 14, 1967
[23] Division of Ser. No. 352,148, Mar. 16, 1964, Pat. No. 3,361,952
[45] Patented Aug. 3, 1971
[73] Assignee Hughes Aircraft Company
Culver City, Calif.

[54] SEMICONDUCTOR DEVICE HAVING LARGE METAL CONTACT MASS
2 Claims, 6 Drawing Figs.

[52] U.S. Cl. .... 317/234 R, 317/234 L, 29/195, 317/235 R
[51] Int. Cl. .... H01l 1/14, H01l 9/12
[50] Field of Search .... 317/234

[56] References Cited
UNITED STATES PATENTS

| | | | |
|---|---|---|---|
| 3,200,490 | 8/1965 | Clymer | 29/473.1 |
| 3,242,391 | 3/1966 | Gorman | 317/234 |
| 3,200,310 | 8/1965 | Carman | 317/234 |
| 2,973,466 | 2/1961 | Atalla et al. | 317/240 |
| 3,290,565 | 12/1966 | Hastings | 317/234 |
| 3,270,256 | 9/1966 | Mills | 317/234 |
| 3,310,711 | 3/1967 | Hangstefer | 317/101 |

*Primary Examiner*—John W. Huckert
*Assistant Examiner*—Martin H. Edlow
*Attorneys*—James K. Haskell and Charles S. Haughey

ABSTRACT: A semiconductor device having a relatively large, low-penetration metal contact mass extending through a passivating layer on a planar surface for assembly or lead attachment. The contact may be formed by silver metal bonded by gold to a silicon device in the plane of the passivating layer with additional metal mass bonded to the first metal mass.

INVENTORS.
John Q. Quetsch, Jr.,
Frank J. Saia,
BY Charles J. Humphrey
ATTORNEY.

SEMICONDUCTOR DEVICE HAVING LARGE METAL CONTACT MASS

This is a division of application Ser. No. 352,148 filed Mar. 16, 1964 now Pat. No. 3,361,952.

This invention relates to semiconductor device manufacture, and more particularly to low-crystal penetration metal contact formation. It is particularly advantageous in silicon device manufacture where the strength of an alloy bonded contact is desirable without deep crystal penetration, and where subsequent operation at relatively high temperatures require a stable structure of such high temperatures.

In the manufacture of surface passivated semiconductor devices, it is desirable to provide a layer of glass over a device surface, and in silicon devices an intervening layer of silicon dioxide is often preferred. Glasses suitable for such applications on silicon include borosilicate glasses, and may be deposited as a frit from a suspension and then sintered, or fused, to form a continuous, bonded and bubble-free layer. A typical borosilicate glass for this purpose may be sintered at about 800° C. for about 6 minutes at temperature. It is accordingly necessary that devices to be glass passivated, or coated, must have metal contacts for lead attachment which can tolerate this glass fusion step at the glass softening temperature range.

In some devices it is desirable to provide a relatively large metal contact mass for lead attachment, particularly in very small devices which are packaged with end plate electrodes contacting the device metal contact without intervening wire leads. Such metal contacts must then be formed without substantial solution of the crystal at subsequent processing temperatures, such as glass fusion temperatures.

In silicon semiconductor technology fabrication problems are severe in that many metals do not easily bond to, or plate on, silicon. Those that do, such as gold, have relatively low eutectic temperatures, and silicon is increasingly soluble therein at higher temperatures. Silver, for example, does not plate well onto silicon, or onto silver-silicon alloy, due perhaps to oxidation of the silicon. Where so plated, silver forms a poor mechanical and electrical bond, and will not alloy well to silicon, or silver-silicon alloy.

The present invention solves the above problems of obtaining penetration of contact metal into the semiconductor crystal, adequate deposit and bonding of contact metal to the crystal, and adequate bonding of contact metal using relatively simple and inexpensive processes and producing very rugged and stable devices well suited for mass production at low cost.

In a typical example a silicon diode is formed having a planar junction forming region and a silicon oxide mask over the planar surface with an aperture over the diffused junction-forming region. A thin film of gold is formed on the junction-forming region where the metal contact is desired, preferably by electroplating using the oxide film as a mask. The gold may be alloyed into the surface at about 500° C. to form a gold-silicon eutectic, if desired, but this is not necessary. A second metal, which will supply more volume of the contact metal, is then deposited on the gold or gold silicon, and electroplating through the mask aperture is preferred. The second metal should form an adequate bond without substantially increasing alloy penetration into the crystal, and it should be sufficiently malleable, or soft, that thermal stress will not cause the crystal to break or crack. Silver is preferred for this step for its unusual combination of properties such as low solubility of silicon in silver, not substantially increasing up to glass sintering temperatures, sufficiently soft for large contact use, and a characteristic "quenching" of gold-silicon alloy in that silver addition very rapidly increases the eutectic temperature of the ternary alloy without substantial additional solution of silicon. Further, silver can be diffusion bonded to gold by heating adjacent surfaces to a temperature at which gold will diffuse rapidly into silver without alloy formation, below the silver-gold melting temperatures, or a gold layer on silver or silver-silicon makes satisfactory plating and bending of silver possible, thus making possible a two-step silver deposit in complex device manufacture.

Although certain noble metals may in some cases be used instead of silver, their cost makes them presently undesirable. Such noble metals include palladium, platinum and rhodium. This invention is therefore primarily directed to the application of silver as a large contact metal to silicon devices in low-penetration contacts, particularly suited for glass passivated devices.

Other advantages and characteristics of this invention will become apparent from the description and explanation of the invention. For a further consideration of what we believe to be novel and our invention, attention is directed to the following portion of this specification, including the drawings, which describes the invention and the manner and process for making and using it.

The invention is of primary value where minimum contact penetration into a doped junction forming region is desired, and where a secure metallic contact bond of a sufficient volume of metallic material for suitable lead attachment is desired. Accordingly, the illustration of the invention herein is in connection with the manufacture of a planar diffused epitaxial silicon diode. The single alloy contact which is shown and described herein is illustrative of the application of this invention to the manufacture of high frequency diodes, and emitter contacts of high frequency shallow diffused emitter transistors.

Figure 1:
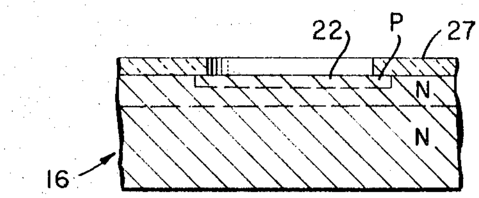
FIGS. 1 through 5 are cross-sectional elevational views of a silicon semiconductor device at successive steps during fabrication thereof according to this invention.

In the drawings, in FIG. 1, a silicon crystal 16 of predominately N conductivity type which may be 0.005 to 0.010 ohm centimeters resistance and about 6 mils thick is supplied with an epitaxial layer 20 of N-type which may be of about 1 to 10 ohm. centimeters resistivity. A silicon oxide diffusion mask 27 is formed on the surface of the epitaxial layer 20 by any suitable means such as exposure to an atmosphere of argon and water vapor at 1,000° C. for 16 hours, thus producing a film of about 1 to 2 microns thickness, and an aperture is then opened in the oxide film by any desired means such as photochemical masking and etching as illustrated, for example, in U.S. Pat. No. 2,981,877 to Noyce and No. 3,025,589 to Hoerni. After forming the opening in the film 27, a P-type conductivity determining impurity such as boron is diffused through the opening and into the crystal surface to convert a region 22 thereof adjacent the opening to P-type. Such a process is illustrated in U.S. Patents to Hoerni, above and Derick and Frosch No. 2,802,760. The formation of the region 22 inherently produces a P-N junction under the protective oxide layer 27; however, the junction is so near the opening that it is preferred to extend the layer 27 further over the region 22 for additional junction protection. This may be done by again subjecting the surface adjacent region 22 to a silicon oxide forming step and reopening a smaller aperture in the reformed film 27.

A film 21 of gold is next deposited on the crystal surface in the opening in the film 27 by any suitable means such as vapor deposit or electroplating. For example, a hydroflouric acid solution is normally used to form the opening in the silicon oxide film, and this solution may be used to further clean the silicon surface of oxide prior to the gold plating step. A gram of potassium gold cyanide may be dissolved in 100 ml. of water to which 5 cc. of hydrofluoric acid is added. The solution, known as a chemical plate solution, will deposit gold upon the silicon surface. A thickness of about 1,000 A. of gold has proven satisfactory. Alternatively an electroplating solution 15 g. of potassium cyanide and 12 g. of potassium gold cyanide in which a liter of deionized water may be used at about 55° C. to electroplate gold on to the silicon. A current of about 5 milliamps may be used with the silicon as a cathode.

The gold film 21 on the silicon region 22 may be alloyed to the surface of the silicon by heating in an inert atmosphere to a temperature above the gold silicon eutectic of 370° C., or to about 500° C. If desired, the first layer of gold may be so deposited and diffused into the silicon at about 1,000° C. to kill lifetime in the completed device, and an additional layer of gold may then be deposited over the surface of the region 22.

A volume 23 of silver is next plated onto the gold film of region 22. For this purpose a suitable plating solution may be provided by mixing a liter of deionized water, 130 g. of potassium cyanide, 30 g. of potassium carbonate, 75 g. of silver cyanide, and 15 g. of potassium hydroxide. It is preferred to add a silver brightener such as described in U.S. patent to Kardos, No. 2,666,738. The solution may be electroplated at room temperature or up to about 50° C.

Although the silver 23 may at this point be heated to alloy with the gold coated silicon region 22 to from an adequate permanent bond, it is preferred to cover the surface including the oxide film 27, with a glass frit which may extend over the silver 23 before heating the silver for the alloying step. A borosilicate glass sold as Corning 7040 by Corning Glass Works has thermal expansion characteristics closely matching those of the silicon material, and may be used in this step.

The glass may be applied as a frit deposited from a suspension of the frit in methanol, in a centrifuge. The coated silicon material is next subjected to a fusion operation sufficient to fuse the glass frit to a glass layer 24, and to alloy the silver to the silicon. About 5 minutes at 850° C. is suitable for this procedure. The silver dissolves a small portion of silicon when heated above the 830° C. silver-silicon eutectic, and forms a silver-silicon alloy 25. Penetration of the silver into the silicon crystal is very small, about 2—3 microns, and relatively independent of the fusion temperature or time used because the solubility of silicon in silver between about 830° C. and 950° C. is nearly constant, increasing very slowly with temperature through this temperature range.

Figure 4:
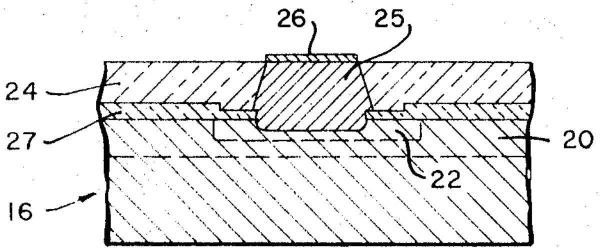

The surface of the silver-silicon alloy 25 is next exposed, as shown in FIG. 4, by polishing the top of the crystal if the silver-silicon alloy projects above the average level of the glass film 24. Otherwise it is necessary to open the glass film over the silver-silicon alloy 25 as by photochemical masking and etching techniques.

To form a sufficiently large volume of silver for subsequent use in making lead attachments, it is usually necessary to adequately bond additional silver to the surface of the silver-silicon alloy. Since silver will not alloy to the silver-silicon at temperatures below the silver-silicon eutectic, with sufficient strength to be useful, a layer 26 of gold is deposited, by electroplating, on the silver silicon alloy and then a layer 29 of silver of relatively large volume is deposited over the gold and will normally extend substantially over the edge of the glass film 24. A plate current of about 150 milliamperes will deposit about 3 to 4 mils of silver in about 4 minutes in the plating procedure previously described. Since the silver will not adhere strongly to the glass, it is necessary to form an exceptionally strong bond through the silver-silicon to the silicon crystal. This is done upon heating with the gold film 26 to about 475° to 490° C. for about 10 minutes followed by slow cooling. If desired, an additional layer of gold plated upon the reverse side of the crystal 16 prior to this step may also be alloyed to the reverse side simultaneously with the alloy-bonding step described. In heating the assembly to about 475° to 490° C. for about 10 minutes, the gold alloys to the silver-silicon 25 forming a gold-silver-silicon-alloy 28, and it diffuses into the silver to form a strong diffusion bond with the silver between a gold-diffused region 30 in the silver and the gold-silver-silicon-alloy 28. The time and temperature of this bonding step may be adjusted within the times and temperature at which such alloying and diffusion bonding will occur, but it must be maintained below the 830° C. silver-silicon eutectic temperature to avoid dissolving silicon into the entire silver body, thus increasing greatly the penetration of the silver into and perhaps through the region 22.

Figure 5:
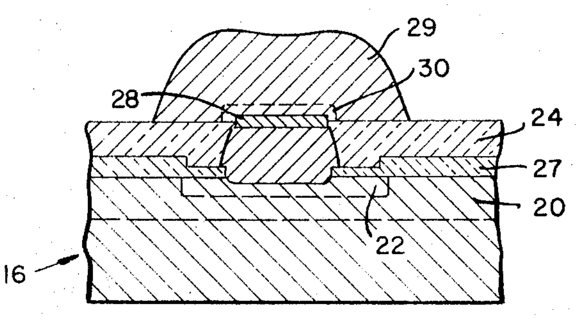
Figure 6:
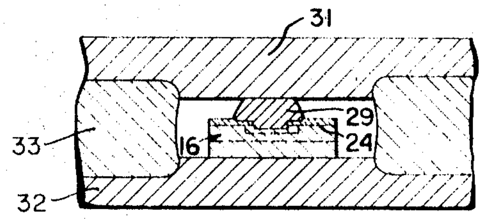
FIG. 6 is a cross-sectional elevational view of the device produced by the foregoing figures in a miniature flat sided and hermetically sealed package.

Although the device of FIG. 5 as above described is now a completed and sealed device and the junction is protected by the silicon dioxide film 27 and the glass film 24, it may be preferred to mount the device into a larger package. This may be done by assembling the completed device 16 between suitable end-plates 31 and 32, which are preferably silver plated, with a surrounding ring of glass 33 and heating the same to hermetically seal the glass ring 33 to end-plates 31 and 32 while simultaneously bonding the end-plates to the silver alloy 30 and the crystal region 17 semiconductor diode device. For this package, the glass ring 33 should have a suitable thermal match with the plates 31 and 32, and should seal adequately thereto. A glass known as Corning Glass No. 8870, sold by Corning Glass Works, Corning, New YORK, is suitable for this purpose, and seals in 3 to 5 minutes at about 710° C. followed by cooling at a rate of not over 38° C. per minute.

Figure 2:
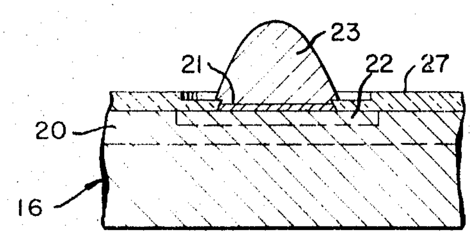

Although the foregoing process produces a low-penetration contact, the volumes of the first gold layer 21 and the first silver deposit 23 in FIG. 2 must be quite closely controlled where, as in epitaxial, shallow diffused devices, very low penetration is desired. In ordinary diode manufacture, the penetration by this process is so small as to be quite insensitive to process variations.

Figure 3:
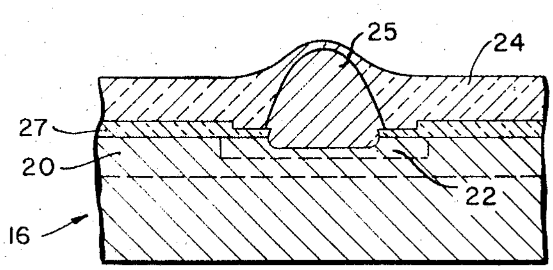

For very fine penetration control, as is very high frequency diodes and planar diffused transistors, this silver and gold contact and bonding system can be further refined to reduce penetration of the crystal markedly. The gold layer 21 should be somewhat heavier, perhaps 2 microns thick, or more, and the same silver layer 23 and glass frit applied. The heating step to form the device of FIG. 3 is carried out below the silver-silicon eutectic temperature of 830 °C., preferably at 800° C. for about 6 minutes, to fuse the glass to about a 10 micron layer for the particular glass here disclosed.

The gold layer 21 will alloy with the silicon at about 370° C., and above about 500° C. the gold will diffuse into the silver forming a diffusion bond. This bonding step, therefore, may be done between 500° C. and about 830° C. to avoid silver entering the gold-silicon phase and, due to its great volume as compared to gold, forming the silver-silicon phase 25. The actual temperature is selected to accommodate the fusion temperature and time requirement of the glass for the layer 24.

In this modification, the gold layer 26 is deposited on a silver phase instead of silver-silicon, and after deposit of the second silver volume 29, the gold 26 will bond both silver volumes above about 500° C., but below 830° C., by the diffusion bonding mechanism. The appearance of FIG. 5 would thus be altered to show a second gold diffused silver region like region 30 just below a gold phase at 28, and the volume 25 would, of course, be silver.

Since the example disclosed herein is a glass passivated diode, it is clear that other variations are possible with other passivating materials, or in production of other devices such as transistors, within the scope of the teaching herein.

We claim:

1. A silicon device, comprising:

a. a silicon body;

b. a silicon oxide mask on the body having an aperture defining a contact area;

c. a silver-silicon phase bonded to the body at the contact area;

d. a silver phase bonded to the silver-silicon phase by a gold phase; and e. a glass layer on said body surrounding the contact area.

2. A silicon device comprising:

a. a silicon body;

b. a silicon oxide mask on the body having an aperture defining a contact area;

c. a first silver phase bonded to the body at the contact area by a gold phase;

d. a second silver phase bonded to the first silver phase by a gold phase; and e. a glass layer on said body surrounding the contact area.